United States Patent [19]
Nishihara

[11] Patent Number: 5,555,208
[45] Date of Patent: Sep. 10, 1996

[54] STATIC RANDOM ACCESS MEMORY

[75] Inventor: Toshiyuki Nishihara, Kanagawa, Japan

[73] Assignee: Sony Corporation, Tokyo, Japan

[21] Appl. No.: 429,778

[22] Filed: Apr. 27, 1995

[30] Foreign Application Priority Data

May 6, 1994 [JP] Japan .................... 6-117634

[51] Int. Cl.⁶ .................................................. G11C 7/00
[52] U.S. Cl. ........................ 365/154; 365/156; 365/161
[58] Field of Search .................... 365/154, 156, 365/161

[56] References Cited

U.S. PATENT DOCUMENTS

| | | | |
|---|---|---|---|
| 4,521,873 | 6/1985 | Heuber et al. | 365/154 |
| 4,653,025 | 3/1987 | Minato et al. | 365/154 |
| 4,796,227 | 1/1989 | Lyon et al. | 365/156 |
| 4,821,235 | 4/1989 | Heald | 365/154 |
| 5,410,506 | 4/1995 | Ferrant et al. | 365/156 |

*Primary Examiner*—David C. Nelms
*Assistant Examiner*—Vu A. Le
*Attorney, Agent, or Firm*—Ronald P. Kananen

[57] ABSTRACT

In the static random access memory, load on a transistor having a gate and drain cross-connected, for example resistance or in general a pull-up element of TFT is reduced, thereby the manufacturing process is significantly simplified.

A memory with a control circuit for stabilizing the operation of the memory cell during stand-by and for reading data is disclosed.

16 Claims, 5 Drawing Sheets

STATIC RANDOM ACCESS MEMORY

BACKGROUND OF THE INVENTION

1. Field of the Invention

The present invention relates to SRAM memory.

2. Description of Related Art

FIG. 1 is a circuit diagram for illustrating the structure of a memory cell in a conventional SRAM (static random access memory). In the figure, the SRAM memory cell comprises a pair of selector transistors 1 and 2, a pair of driver transistors 3 and 4 cross-connected from drains to gates of each other, and a pair of pull-up elements 5 and 6 connected to the drains of the driver transistors 3 and 4. For the pull-up elements 5 and 6, load resistances or PMOS's (p-type metal oxide film semiconductors) are used.

Recently, the above-mentioned conventional SRAM memory cell has been modified in structure; that is, the pull-up elements 5 and 6 made of polycrystal silicon are laminated on the selector transistors 1 and 2, and driver transistors 3 and 4. By applying this technique, the area of the memory cell can be reduced. However, the above-mentioned structure is disadvantageous because a number of processes for manufacturing increases, and in addition, metal processing on the top layer becomes difficult due to a complex structure of the laminate and step gaps on the memory cell.

Diffusion of an impurity is very fast in polycrystal silicon, when the designed size is small, in that the impurity diffuses from both the ends of a resistance, and the impurity can make the thin film transistor (TFT) of resistance or PMOS conductive. The size of the memory cell cannot therefore be minimized due to the restriction arising from the diffusion of the impurity. This is another disadvantage.

OBJECTS AND SUMMARY OF THE INVENTION

It is a first object of the present invention to reduce pull-up elements in an SRAM memory cell.

It is a second object of the present invention to reduce manufacturing processes and eliminate the restrictions on process conditions by reducing elements.

It is a third object of the present invention to provide a controlling circuit which operates the simplified SRAM memory stably.

To attain the above-mentioned objects, an SRAM memory according to the present invention is provided with a pair of the first metallic insulated semiconductors with a first conduction type cross-connected with the drain to the gate to each other, and a pair of the second metallic insulated semiconductor transistors with the second conduction type for address selection having conductive characteristics opposite to the first conduction type provided correspondingly to each of the first metallic insulated semiconductor transistors.

An SRAM memory cell of the present invention, in the above-mentioned SRAM memory cell, is provided with a pair of the third metallic insulated semiconducting transistors of the second conduction type provided in parallel with transfer gates of the second metallic insulated semiconductors having gate electrodes connected to each gate electrode of the first metallic insulated semiconductor on the corresponding side respectively.

An SRAM memory cell of the present invention, in the above-mentioned SRAM memory cell, is provided with the second and third metallic insulated semiconductor transistors which are one or another of dual gate thin film transistors.

In the present invention, the second metallic insulated semiconductor transistors and the first metallic insulated semiconductor transistors of the memory cell are formed of the second conduction type and the first conduction type respectively, wherein the first metallic insulated semiconductor transistors are operated as pull-up elements during stand-by; thereby data is retained with a supply of power from bit lines.

Accordingly, pull-up elements can be eliminated from an SRAM memory cell, consequently manufacturing process is significantly simplified.

DETAILED DESCRIPTION OF THE PREFERRED EMBODIMENTS

Preferred embodiments of the present invention will be described in detail referring to drawings hereinafter.

Figure 1:
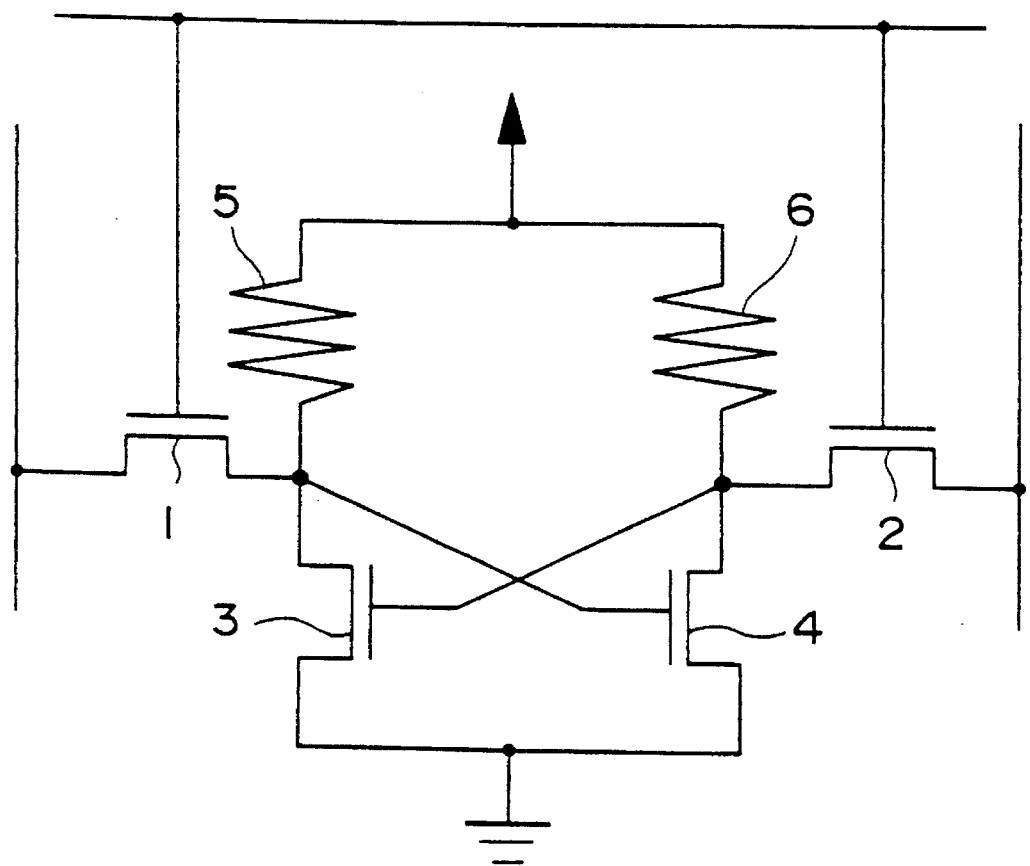
FIG. 1 is a circuit diagram for illustrating the structure of a conventional SRAM memory cell.
Figure 2:
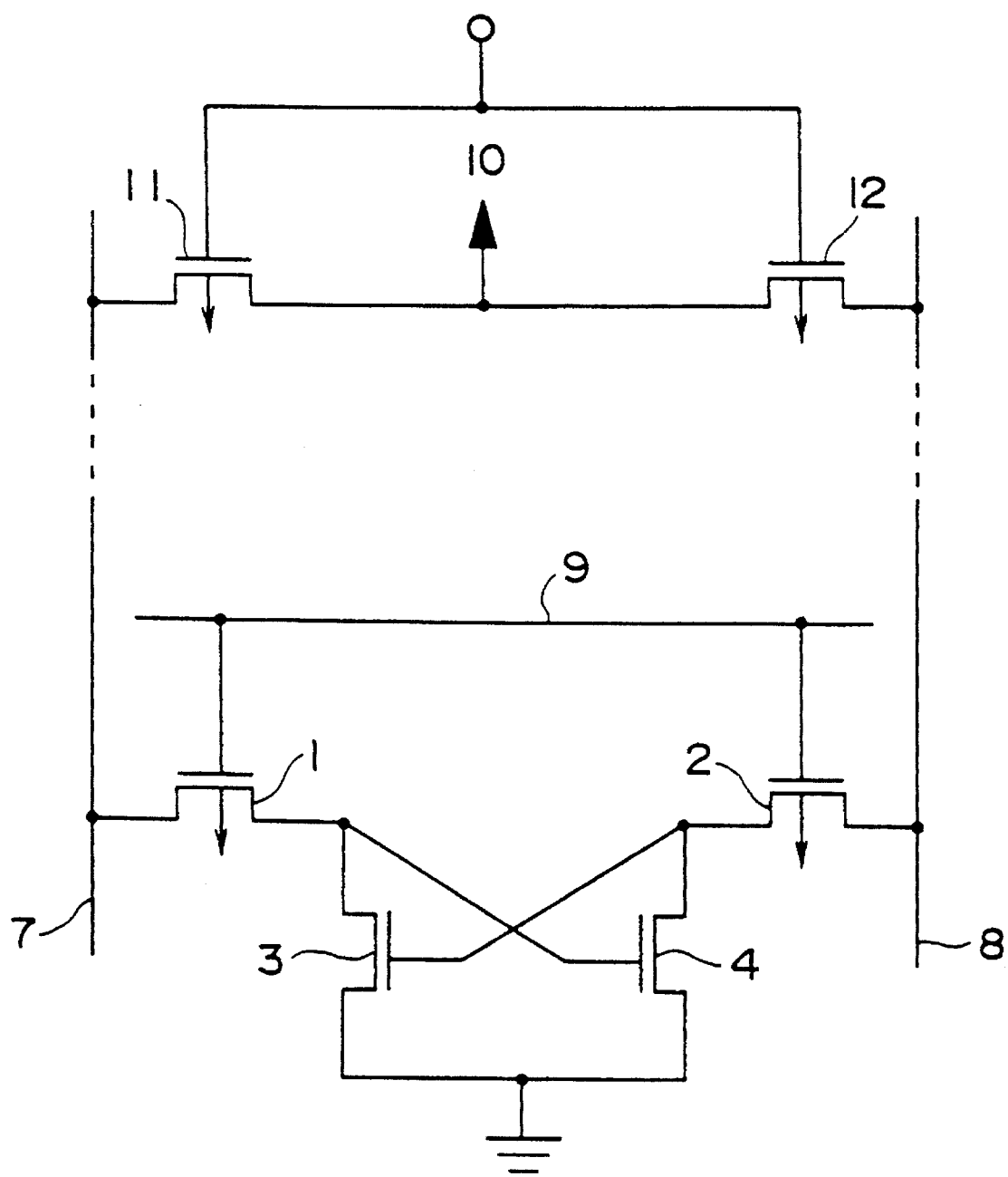
FIG. 2 is a circuit diagram for illustrating the structure of an SRAM memory cell of the first embodiment in accordance with the present invention.

FIG. 2 is a circuit diagram for illustrating an SRAM memory cell of the first embodiment in accordance with the present invention. In the figure, the members corresponding to FIG. 1 are represented by the same symbols as used in FIG. 1, and the description is thus omitted. In FIG. 2, pull-up elements 5 and 6 are eliminated from the memory cell of the first embodiment although the pull-up elements are provided for the conventional memory cell as illustrated in FIG. 1. PMOS type transistors are used as the selector transistors 1 and 2. Reference numerals 7 and 8 refer to bit lines for designating a Y address (column address), and a word line 9 is printed for designating an X address (row address). Power is supplied from a power source 10 to the selector transistors 1 and 2 through path transistors 11 and 12.

In the structure described above, data is retained during stand-by as described hereunder.

The word line 9 is maintained at an intermediate voltage between 0 V and Vcc. For example, in the case of c=3 V, when a threshold value Vth is 1 V, it is preferable to set the voltage of the word line 9 at 2.5 V which provides sub-threshold current sufficient for data retention at a voltage of the threshold voltage Vth or lower. The memory cell is supplied with power from the power source 10 connected to the bit lines 7 and 8 through the path transistors 11 and 12. The reason for use of PMOS for the selector transistors 1 and 2 is to supply full-range power Vcc under the above-mentioned condition. By applying this structure, discharging with time from the storage node on the high level side is compensated, and data can be retained.

Figure 3:
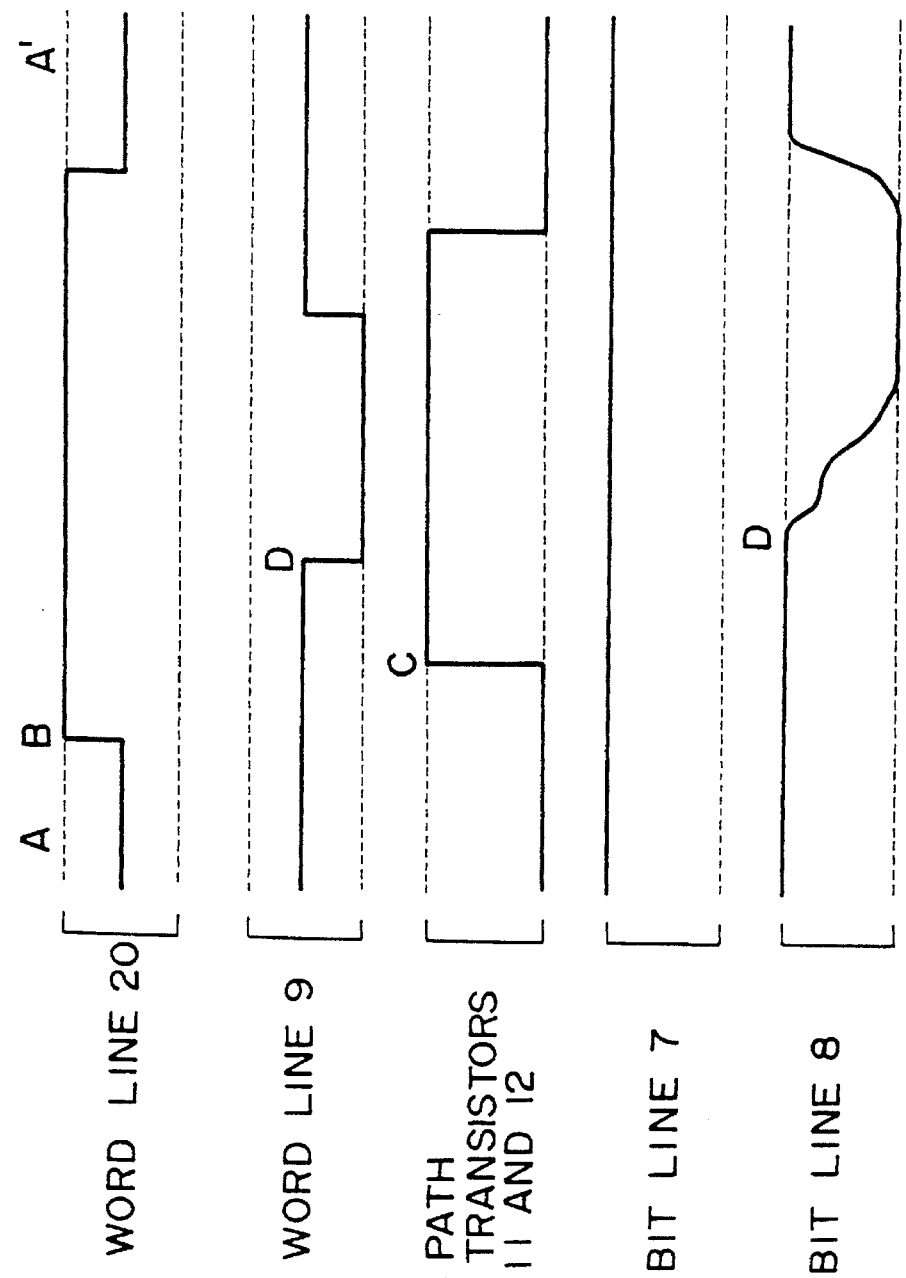
FIG. 3 is a timing chart for describing the operation of the first embodiment of the invention illustrated in FIG. 2.

On the other hand, data is read as described hereunder. Data reading operation is described referring to a timing chart shown in FIG. 3. As illustrated in FIG. 3, in a stand-by state A, the word line 9 and the word line 20 of a non-selector cell are maintained at an intermediate voltage. At timing B, the voltage of the word line 20 of a non-selector cell is raised to 3 V or higher to disconnect the memory cell from the bit lines. Then, at timing C, the gates of the path transistors 11 and 12 are made to a high impedance to stop the supply of power to the bit lines 7 and 8.

Finally, at timing D, the voltage of the word line 9 is dropped to 0 V to fully turn on the selector transistors 1 and 2. Thereby, the voltage of the bit line 8 connected to the node at a low level is reduced, and data can be read. The voltage of the bit line 8 can be reduced to near ground level by activation of a sense amplifier.

As described above, according to this embodiment, the selector transistors 1 and 2 of the memory cell are made of PMOS, the driver transistors 3 and 4 are made of NMOS, and during stand-by the selector transistors 1 and 2 are operated as pull-up elements. Thereby, power is supplied from the bit lines. Thus, by applying the memory cell structure as described herein above, pull-up elements can be eliminated from an SRAM memory cell, and manufacturing processes are significantly reduced.

Figure 4:
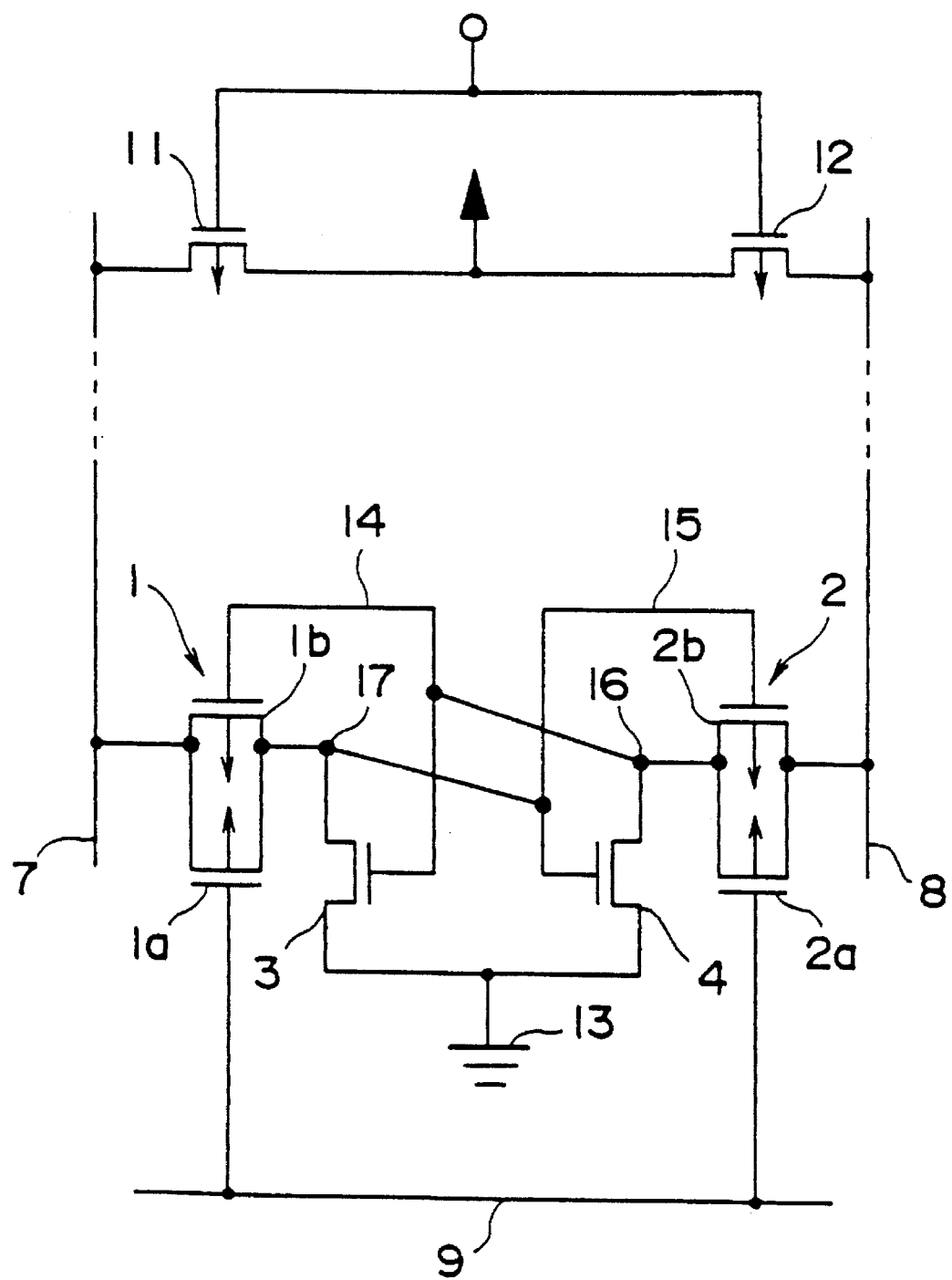
FIG. 4 is a circuit diagram for illustrating the structure of an SRAM memory cell of the second embodiment in accordance with the present invention.

The second embodiment in accordance with the present invention is described hereunder. FIG. 4 is a circuit diagram for illustrating the structure of the second embodiment. In the figure, the members corresponding to FIG. 2 are represented by the same symbols as used in FIG. 2, and the description is omitted. In the second embodiment, each element is formed on an SOI (silicon on insulator) substrate comprising an insulation layer and silicon single crystal formed on the insulator layer. Dual gate type TFTs (XMOS structure), whose channels are sandwiched between independent surface gates 14 and 15 and a common back gate served as the word line 9, are used as selector transistors 1 and 2. In the structure, gate electrodes of transistors 1a and 2a on one side of the dual gate type TFTs comprising a pair of transistors are connected to the word line 9, and gate electrodes of transistors 1b and 2b on another side are connected to gate electrodes of driver transistors 3 and 4 on the corresponding side respectively.

The selector transistors 1 and 2 are so set as to be turned off consistently while the word line is in a high state, and to be turned on consistently while the word line is in a low state regardless of fluctuation in voltage of the surface gates 14 and 15 within the power source voltage. When a certain intermediate voltage, for example, 1.5 V, is applied on the word line 9, the selector transistors 1 and 2 are so set as to be turned off while the surface gate 14 or surface gate 15 is in a high state, and to be turned on while the surface gate 14 or surface gate 15 is in a low state.

For example, when the node 16 on the right side is in a high state, data is retained as described hereunder. In this case, the word line 9 is maintained at an intermediate voltage of, for example, 1.5 V. Then, the selector transistor 1 is turned off because the surface gate 14 is connected to the node 16 in a high state, and the selector transistor 2 is turned on because the surface gate 15 is connected to the node 17 in a low state.

In the same way as the first embodiment described herein above, in the second embodiment, power is therefore supplied to the node 16 through the bit line 8, and thus data is retained stably. Dissipation current during stand-by is very small due to no through current.

On the other hand, data is read as described hereunder. At first, the voltage of the word line of a non-selector cell is raised to disconnect the bit lines from the cell. Then, the path transistors 11 and 12 are turned off, and then the voltage of the word line 9 of the selector cell is reduced to turn on the selector transistors 1 and 2. Thereby, the voltage of the bit line 7 connected to the node 17 in a low state is reduced, and data is read. In this reading operation, the current capacity of the selector transistor 2 in a high state which has been turned on is large; on the contrary, the current capacity of the selector transistor 1 in a low state which has been turned off is small. In the second embodiment, data inversion does not therefore happen and stable reading operation is expected.

Figure 5:
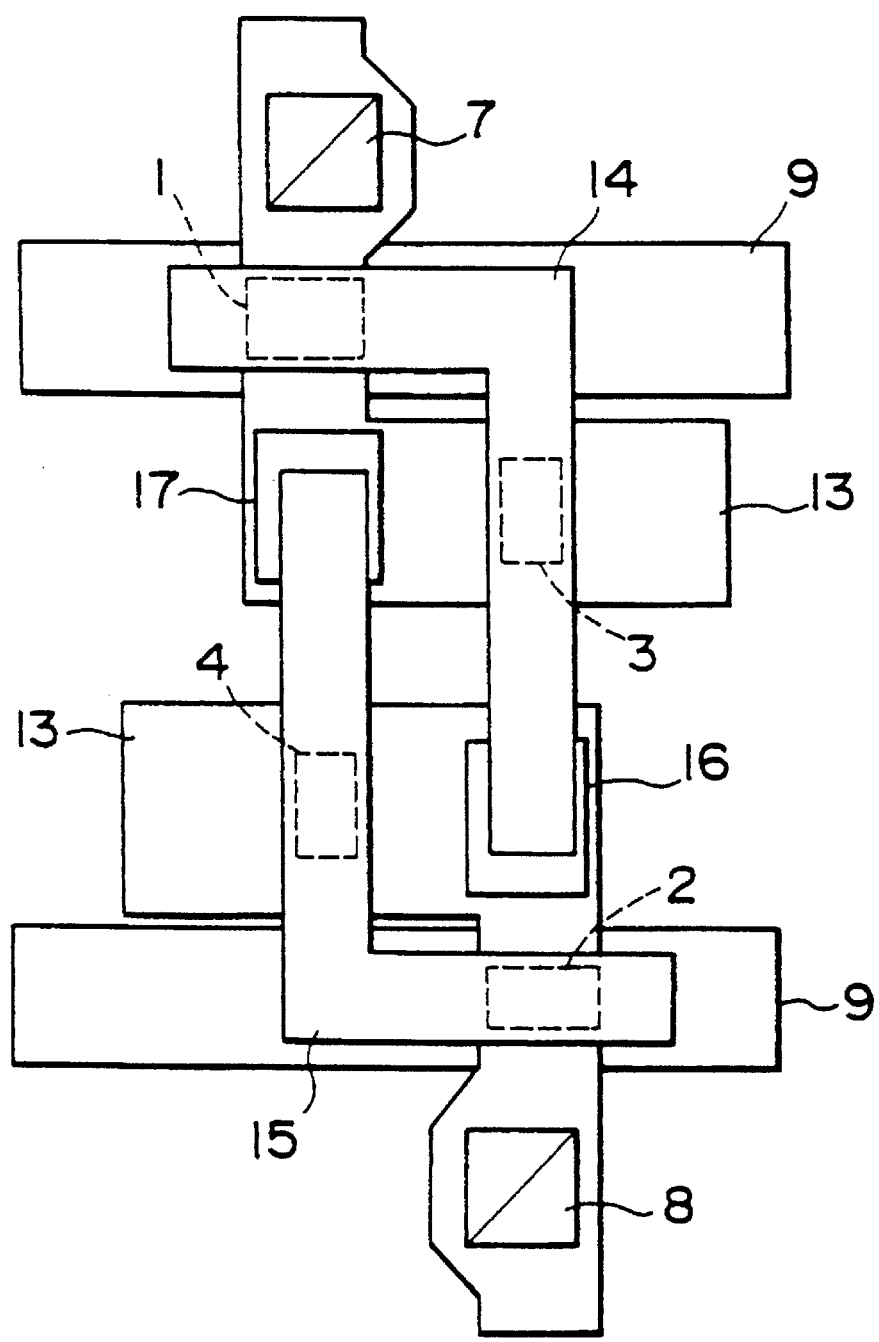
FIG. 5 is a top view for illustrating an example of a laminate layout of an SRAM memory cell in the second embodiment.

The third embodiment in accordance with the present invention is described hereunder referring to FIG. 5 for illustrating an example of a laminate layout of the second embodiment. In the figure, the selector transistors 1 and 2 are made of PMOS, and function as pull-up elements during stand-by. The driver transistors 3 and 4 are made of NMOS. Source/drain diffusion layers of NMOS type driver transistors 3 and 4 and PMOS type selector transistors 1 and 2 are connected at the nodes (diffusion layers) 16 and 17 using, for example, a SARICIDE technique. One end of the diffusion layers 13 is connected to Vss and the other end is connected to bit lines 7 and 8. The surface gates 14 and 15 are connected to the nodes (diffusion layer) 16 and 17 respectively. The back surface gates, namely two word lines 9 of a split gate type are in the cell and provided under the channels of the selector transistors 1 and 2 for use as back gates.

As described above, the memory cell of the third embodiment is patterned with the same cell area as a conventional memory cell as illustrated in FIG. 4. By applying the third embodiment, therefore, reduction of dissipation power during stand-by and stabilization of operation are accomplished in addition to reduction of manufacturing processes.

According to the present invention, a pair of the first metallic insulated semiconductors with the first conduction type are cross-connected from the drain to the gate of each other, and a pair of the second metallic insulated semiconductors with the second conduction type for address selection having conductive characteristics opposite to the first conduction type provided correspondingly to each first metallic insulated semiconductor are provided to eliminate the lamination of pull-up elements and to shorten the manufacturing process advantageously.

According to the present invention, in the above-mentioned SRAM memory cell, a pair of the third metallic insulated semi-conducting transistors of the second conduction type provided in parallel with transfer gates of the second metallic insulated semiconductors, having gate electrodes connected to each gate electrode of the first metallic insulated semiconductors on the corresponding side respectively is provided to accomplish the reduction of dissipation power during stand-by and stabilization of operation in addition to the reduction of manufacturing processes together advantageously.

According to the present invention, in the above-mentioned SRAM memory cell, the second and third metallic insulated semi-conducting transistors are one or another of dual gate thin film transistors to accomplish the reduction of dissipation power during stand-by and stabilization of operation in addition to the reduction of manufacturing processes.

What is claimed is:

1. An SRAM memory cell comprising:

a pair of first metallic insulated semiconductor transistors with a first conduction type cross-connected from the drain to the gate of each other; and a pair of second metallic insulated semiconductor selector transistors with a second conduction type for address selection in cooperation with bit lines in circuit with said selector transistors and a word line in circuit with a gate of each of said selector transistors and having conductive characteristics opposite to said first conduction type provided correspondingly to each of said first metallic insulated semiconductors;

a source of power;

a pair of third metallic insulated semiconducting path transistors of the second conduction type provided in parallel with transfer gates of said second metallic insulated selector transistors and having gate electrodes connected to each gate electrode of said first metallic insulated semiconductors on a corresponding side thereof respectively, wherein said third metallic insulated semiconducting path transistors operate as pull-up elements.

2. An SRAM memory cell, comprising:

a pair of first metallic insulated semiconductor transistors having a first conduction type cross-connected from the drain to the gate of each other; and a pair of second metallic insulated semiconductor transistors with a second conduction type for address selection having conductive characteristics opposite to said first conduction type provided correspondingly to each of said first metallic insulated semiconductors;

a pair of the third metallic insulated semiconducting transistors of the second conduction type provided in parallel with transfer gates of said second metallic insulated semiconductors, having gate electrodes connected to each gate electrode of said first metallic insulated semiconductors on the corresponding side respectively.

3. An SRAM memory cell claimed in claim 2, wherein said second and third metallic insulated semi-conducting transistors are one or another of dual gate thin film transistors.

4. An SRAM memory cell claimed in claim 3, wherein said second and third metallic insulated semiconductor transistors are p-type semiconductors.

5. An SRAM memory cell claimed in claim 3, wherein said second and third metallic insulated semiconductor transistors are made of polycrystal silicon.

6. An SRAM memory cell claimed in claim 2, wherein said first and second metallic insulated semiconductor transistors are formed on an insulator.

7. An SRAM memory cell further comprising:

a pair of the first metallic insulated semiconductor transistors of a first conduction type and cross-connected from the drain to the gate of each other;

a pair of the second metallic insulated semiconductor transistors of a second conduction type for address selection having conductive characteristics opposite to said first conduction type provided correspondingly to each said first metallic insulated semiconductor transistors;

a pair of bit lines connected respectively to the output of said pair of second metallic insulated semiconductor transistors;

a pair of the third metallic insulated semiconductor transistors made of the second conduction type and output-connected to said pair of bit lines;

a reference power source connected to other output ends of said pair of third metallic insulated semiconductor transistors respectively;

a control terminal connected to a common input terminal of said pair of third metallic insulated semiconductor transistors; and dual gate thin film transistors having channels sandwiched between independent surface gates 14 and 15 and a common back gate serving as a word line.

8. An SRAM memory cell comprising:

a pair of first metallic insulated semiconductor transistors with a first conduction type and cross-connected from the drain to the gate of each other;

a pair of second metallic insulated semiconductor transistors with a second conduction type for address selection having conductive characteristics opposite to said first conduction type and provided correspondingly to each of said first metallic insulated semiconductor transistors;

a pair of bit lines connected respectively to the output of said pair of second metallic insulated semiconductor transistors;

a pair of the third metallic insulated semiconductor transistors made of the second conduction type and output-connected to said pair of bit lines;

a reference power source connected to other output ends of said pair of third metallic insulated semiconductor transistors respectively;

a control terminal connected to a common input terminal of said pair of third metallic insulated semiconductor transistors; and a pair of fourth metallic insulated semiconductor transistors of the second conduction type provided in parallel with transfer gates of said second metallic insulated semiconductor transistors, and having gate electrodes connected to each gate electrode of said first metallic insulated semiconductor transistors on a corresponding side thereof respectively.

9. An SRAM memory cell claimed in claim 8, wherein said second and fourth metallic insulated semiconducting transistors are one or the other dual gate thin film transistors.

10. An SRAM memory cell claimed in claim 9, wherein said second and third metallic insulated semiconductor transistors are p-type semiconductors.

11. An SRAM memory cell claimed in claim 9, wherein said second and third metallic insulated semiconductor transistors are made of polysilicon.

12. An SRAM memory cell claimed in claim 7, wherein said first, second, and third metallic insulated semiconductor transistors are formed on an insulator.

13. An SRAM memory cell claimed in claim 1, wherein said second and third metallic insulated semiconducting transistors are one or another dual gate thin film transistors.

14. An SRAM memory cell claimed in claim 13, wherein said second and third metallic insulated semiconductor transistors are p-type semiconductors.

15. An SRAM memory cell claimed in claim 13, wherein said second and third metallic insulated semiconductor transistors are made of polycrystal silicon.

16. An SRAM memory cell claimed in claim 1, wherein said first and second metallic insulated semiconductor transistors are formed on an insulator.

* * * * *